ELECTRICAL CIRCUIT FABRICATION

Filed Nov. 25, 1964 4 Sheets-Sheet 1

INVENTOR.
Jerome H. Lemelson

INVENTOR.
Jerome H. Lemelson

United States Patent Office 3,461,347
Patented Aug. 12, 1969

3,461,347
ELECTRICAL CIRCUIT FABRICATION
Jerome H. Lemelson, 85 Rector St., Metuchen, N.J. 08840
Continuation-in-part of application Ser. No. 86,838, Dec. 27, 1960. This application Nov. 25, 1964, Ser. No. 422,875
Int. Cl. H02b 1/04
U.S. Cl. 317—101 13 Claims This invention relates to electrical components and circuit elements and means for manufacturing the same. This application is a continuation in part of my copending application Ser. No. 86,838 filed Dec. 27, 1960, now U.S. Patent 3,169,892 entitled Method for Making a Multi-Layered Electrical Circuit and Ser. No. 310,945 filed Sept. 23, 1963.

It is known in the art to provide an electrical circuit or circuit element by chemically removing or etching areas of a sheet of metal bonded to a base. The general term "printed circuit" has been applied not only to circuits which are printed or silkscreened on a base or circuit board but also to circuits which are formed by etching. Metal sheet or foil in the order of several thousandths of an inch in thickness or greater is generally employed for the conducting components of such circuits. Such material is not easily applied in the fabrication of so called microminiature circuits due to a number of shortcomings. One drawback for such metal sheeting is its comparative thickness. Another resides in the means heretofore provided for insulating exposed surfaces and applying circuits thereover. Dielectric plastic materials have been coated over exposed circuit elements but these generally are not easy to apply and circuit elements are not easily applied thereover without further preparation and treatment of the plastic. In order to be cured, such plastic requires heating and the retention of temperatures for prolonged periods of time.

It is accordingly a primary object of this invention to provide a new and improved structure in an electrical circuit and an improved method of making the same.

Another object of this invention is to provide an improved electrical element and an insulation therefore.

Another object is to provide improved means for fabricating multi-layer electrical circuits having a high density of conducting elements and applicable to the manufacture of microminiature components and circuits.

Another object is to provide an improved method of electrically insulating a circuit member with an oxide film or coating formed directly on the circuit member.

Another object is the provision of improved multiple layer circuits and improved methods for forming said circuits by vacuum deposition of both of the conducting portions of said circuits and the insulating interlayers thereby eliminating the need for chemical etching of circuits members.

Still another object is the provision of a new method of making multiple layer circuits over an extended area of a circuit board with each layer being of substantially constant thickness and containing conducting as well as non-conducting portions, thereby simplifying fabrication and permitting the stacking of multiple layers containing circuits between insulating layers without circuit elements extending out of a particular layer so that any number of circuit layers may be built up without difficulty, while retaining a flat upper surface.

Another object is to provide an improved method of fabricating an electrical conductor containing a resistance portion. Another object is to provide a method of fabricating an electrical conductor pair in a capacitance circuit.

Another object is the provision of a new type of electrical resistor and a new capacitor both of which are applicable to microminiaturized circuitry.

Another object is to provide an improved method of forming a dielectric film on an article of manufacture by sequentially or simultaneously vacuum depositing a metal and converting the deposited metal in the same chamber to a dielectric material.

Another object is to provide an improved method of insulating articles of manufacture.

Yet another object is to provide an improved method of vacuum coating articles of manufacture.

Still another object is to provide improved means for constructing circuits and securing elements thereto.

Another object is to provide an improved means for making a circuit from a single layer of conducting material without the need for etching or mechanically removing portions of said conducting material.

Another object is to provide means for fabricating circuits and circuit components of a high degree of precision without the possibility of contaminating portons thereof.

With the above and other such objects in view, as may hereinafter more fully appear, the invention consists of the novel construction, combination and arrangement of parts as well as methods of fabrication which will be hereinafter more fully described and illustrated in the accompanying drawings, wherein there are shown embodiments of the invention but it is to be understood that changes, variations and modifications may be resorted to which fall within the scope of the invention as claimed.

In the drawings, which form part of the description:

Figures 9, 10:
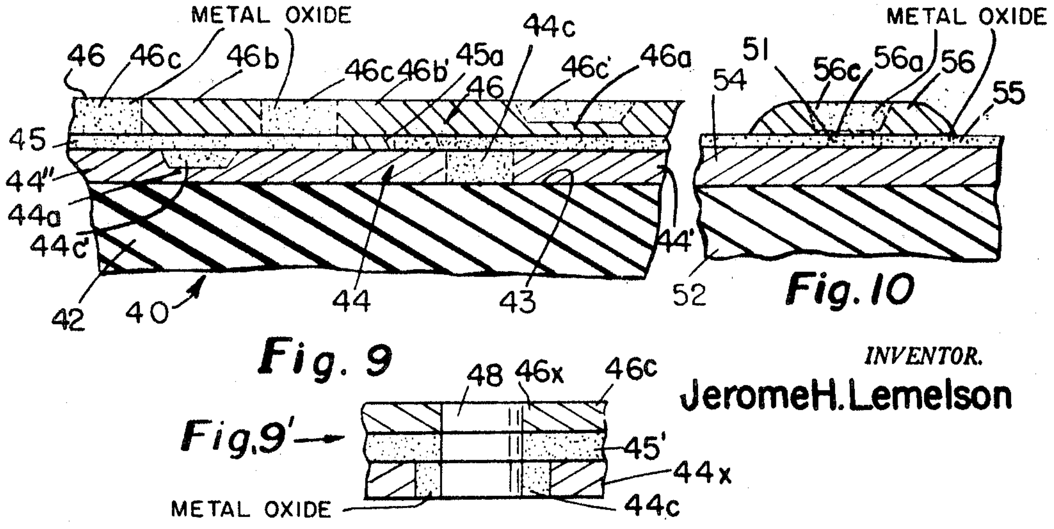
FIG. 9 is an end cross-section of a circuit board showing multiple layers of conductors dielectrically separated from each other with means for interconnecting alternate layers and for producing circuits thereof.
Figures 11, 12:
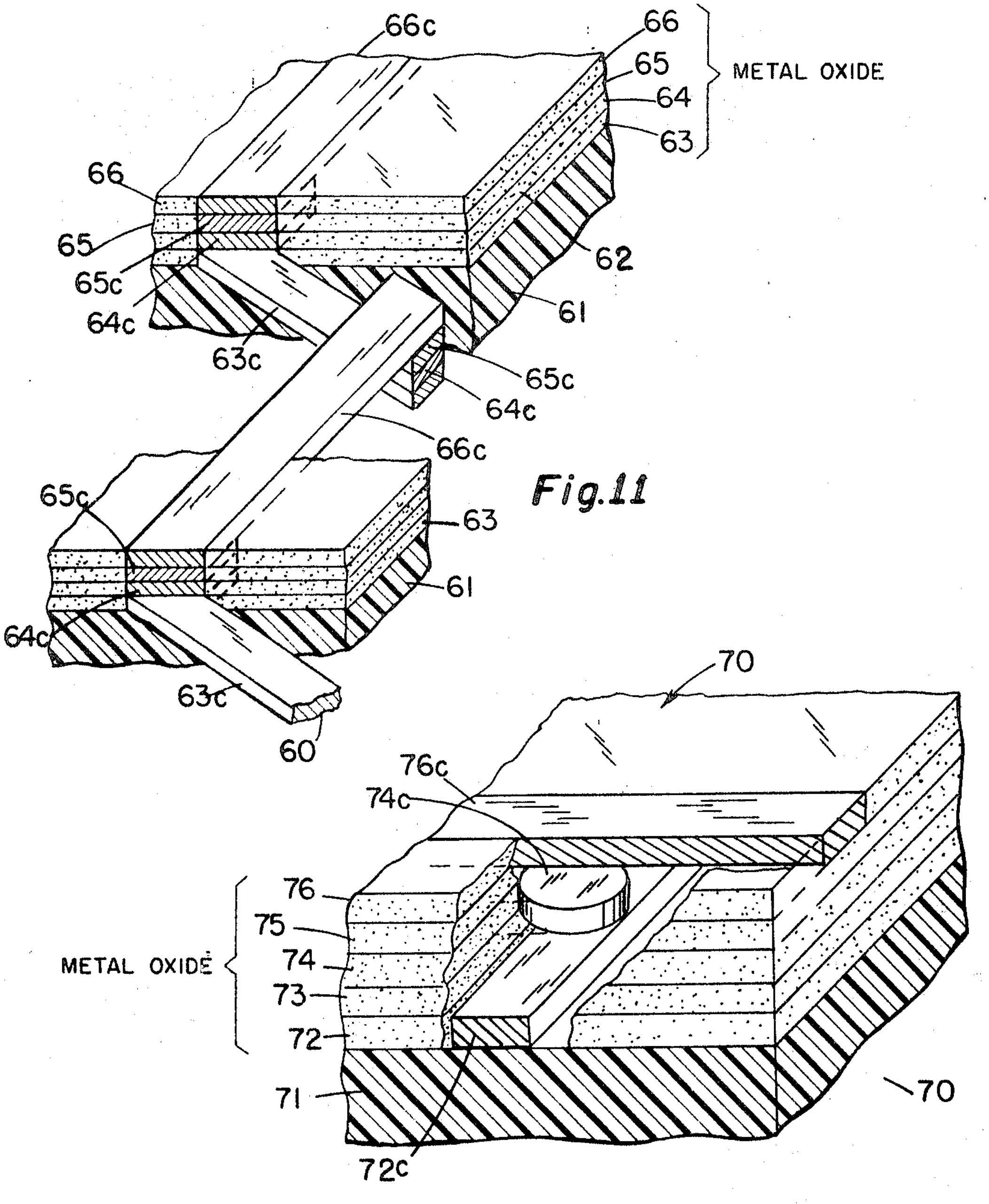
Figure 13:
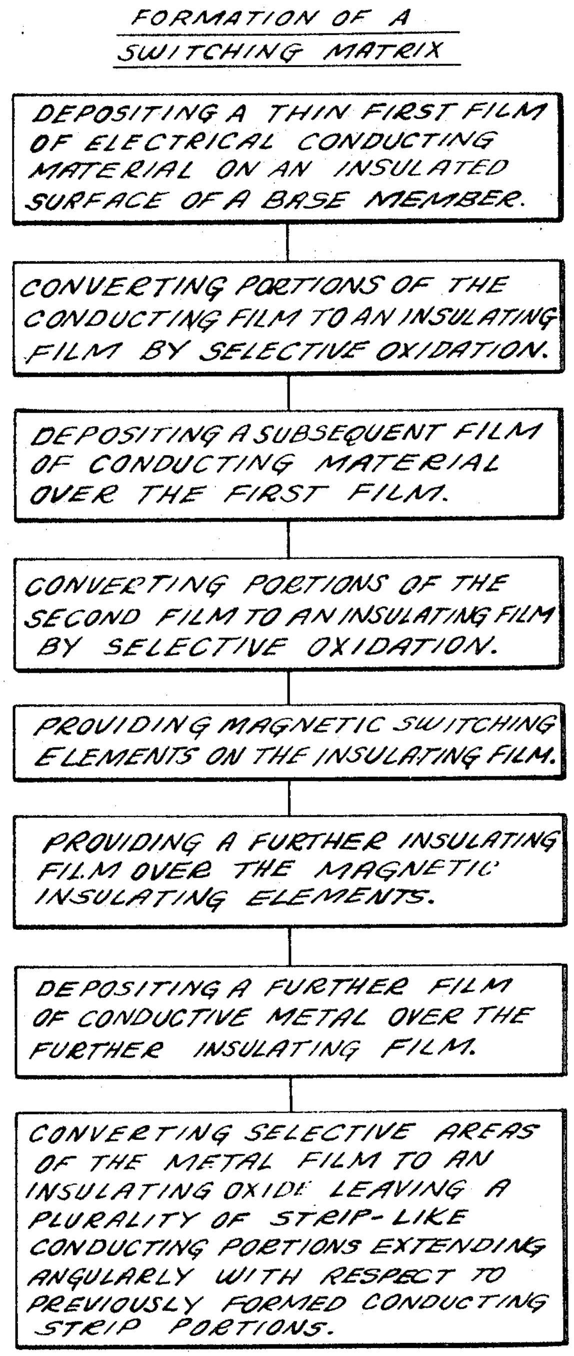
Figure 14:
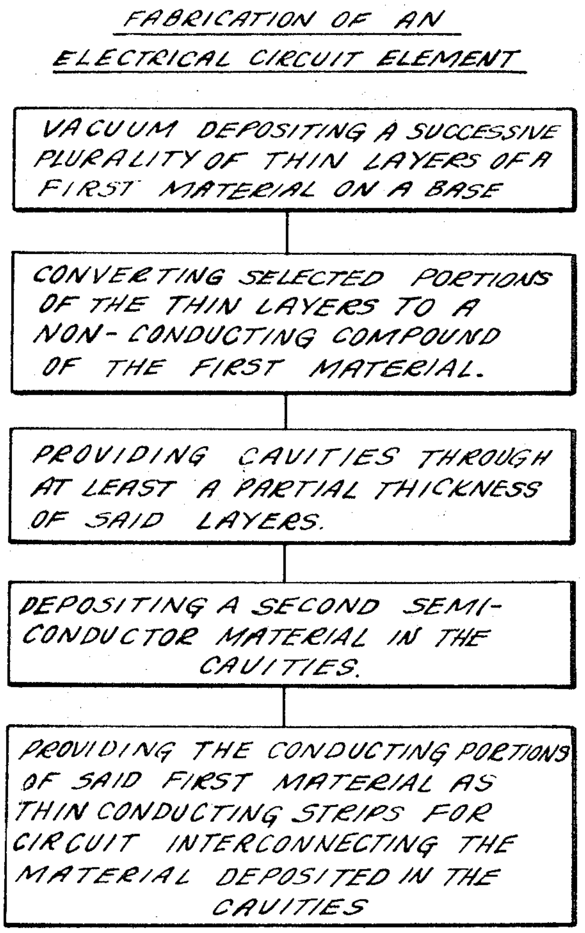

FIG. 9' shows a further circuit structure in cross-section applicable to the other structures illustrated;

FIG. 10 shows a structure in a conductor in cross-section which conductor has been partly converted to a dielectric material;

FIG. 11 shows how the multiple-layer fabrication technique may be utilized to form a novel inductor structure;

FIG. 12 shows the form of a magnetic switching matrix in accordance with the instant invention;

FIG. 13 depicts the sequence of steps used to form a switching matrix in accordance with the instant invention;

FIG. 14 depicts the sequence of steps used to form an electrical circuit element including a semi-conductor material deposited within cavities.

Figures 1, 2, 3, 4, 5, 6, 7, 8:
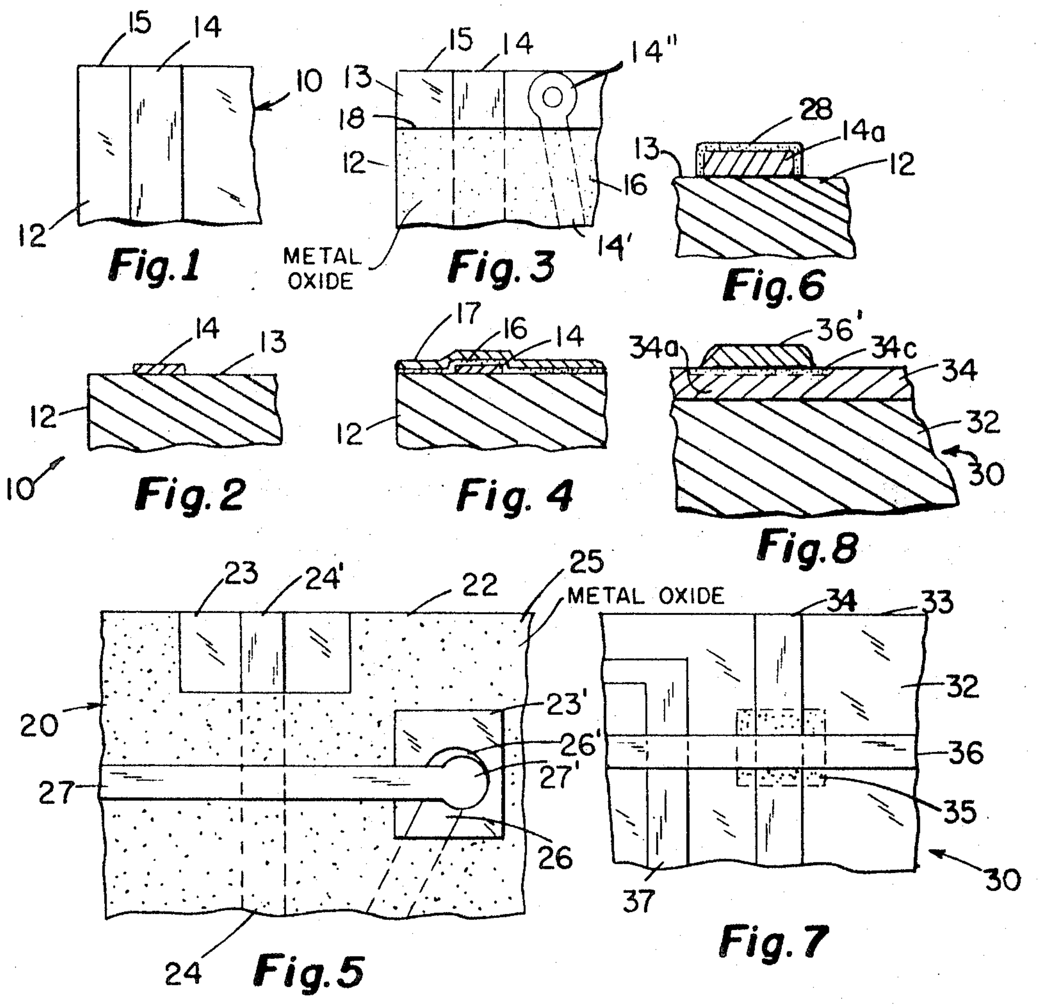
FIG. 1 is a fragmentary view taken from above a circuit member prior to further fabrication thereof and FIG. 2 is an end cross-sectional view of the fragment of FIG. 1.
FIG. 3 shows the circuit member of FIG. 1 further processed with an insulating layer which has been formed from a layer of metal.
FIG. 4 is a cross-section of FIG. 3.
FIG. 5 is a plan view of a circuit board showing further details of structure applicable to multi-layer circuits.
FIG. 6 is a cross-section of part of a circuit element on a base which element has been insulated in accordance with the teachings of the invention.
FIG. 7 shows a further circuit structure in plan view.
FIG. 8 is a cross-sectional view of still another structure in a circuit element and an insulating portion thereof.

FIG. 1 and 2 illustrate a portion of an electrical circuit member such as a circuit board or other component consisting of an assembly 10 of a base 12 which is preferably made of insulating material and which has an electrical circuit member 14 bonded or otherwise secured to its upper surface 13 and illustrated as shaped in a thin strip, layer or film of electrically conducting metal. It is assumed that the circuit conductor 14 terminates at or near an edge 15 of the base or board 12 at which end it may be electrically connected to another circuit or an electrical device. The element 14 may have any suitable thickness varying from that of a thin film in the order of microns in thickness or less to that of a strip of metal applied directly to surface 13 per se or formed thereon after etching a larger sheet or coating of metal bonded to surface 13. In other words, the conducting circuit element 14 may be applied as a sheet of metal to base 12, electro-deposited on the upper surface 13 or base 12 by various known techniques, or metallized or vacuum coated on 13 either in the shape illustrated or as a uniformly distributed layer which is therefater shaped by a mechanical or chemical action.

In FIGS. 3 and 4 a coating or film 16 of metal has been applied by vacuum depositing from the vapor state or electro-deposition of said metal completely over substantially all of the exposed surface of said film or strip 14 and preferably over most of the adjacent surface 13 of base 12. The entire layer or film 16 is thereafter completely converted to a non-conducting or dielectric material so that it forms an insulating coating for the conductor 14. The notation 18 refers to a line defining the edge of a mask which is placed adjacent the edge 15 of the circuit board 12 either prior to the application of the conducting layer 16 thereto or prior to the application of the material or atmosphere which converts layer 16 to a dielectric material so that the end portion 14' of conductor 14 is either exposed or consists entirely of an electrically conducting material and may therefore be electrically connected to another component or circuit by soldering, welding or fastening means.

The base 12 may consist of any suitable rigid or flexible insulating material such as thermo-setting plastic, glass, plastic-glass laminates or the like. It may also comprise a sheet of metal the upper surface of which is coated with or converted to an insulating layer on which conductor 14 is deposited or secured. The conductor 14 may consist of any suitable conducting metal. The metal applied as layer 16 may also comprise any suitable metal which may be entirely converted thereafter to a non-conducting compound of said metal. For example, layer 16 may at first comprise a coating or film of aluminum which is vacuum or electro deposited on layer 14 and base 12. It may thereafter completely be oxidized by exposure to a suitable atmosphere to form a dielectric coating. If the layer 16 is thin enough, it will convert to aluminum oxide in air at room temperature. The process may be hastened for heavier layers of alumnium such as sheet by applying oxidizing gases or vapors thereto. For example, it the coating or layer 16 is heated in the range of 300 to 600 degrees centigrade and is exposed to an atmosphere of hydrogen fluoride or is exposed to elemental fluorine, the resulting reaction, if sustained long enough. may be used to convert the entire layer 16 to the metal fluoride compound. A coating of such fluoride in the order of 1 to 2 microns in thickness will exhibit a resistance value in the order of $10^{10}$ or more ohms. Depending on the thickness of layer 16, it may be necessary to sustain the reaction for a period of time in which a small portion of the outer layer of conducting element 14 is also reacted upon by oxidizing atmosphere or material and is converted to a dielectric compound to guarantee complete conversion of all the metal of layer 16.

The notation 14' in FIG. 3 refers to a second conducting strip on base 12, the end of which is shaped with an eye 14'' which is exposed for connection thereto.

In FIG. 5, there is illustrated a portion of an electrical device 20 which is fabricated in accordance with the teachings and the technique of FIGS. 1 to 4 and in which a further conducting element is applied to the base. The insulating base 22 may be any suitable shape and is illustrated as a flat sheet or plate. Applied first thereto, as described, is a thin strip of conducting material referred to by the notation 24. Applied over that surface of base 22 against which strip 24 is applied, is a coating or film of metal 25 which is entirely converted to a dieelectric coating or film as described. The notation 23 refers to a portion of the surface of base 22 containing thereon base 24 which does not contain the dielectric covering 25 and is thereby accessible for connection to another circuit device or element. A second circuit element 26 which may also be an extension of strip 24, extends beneath the dielectric covering 25 against the upper surface of base 22. A second area 23' of the surface of base 22 on which the end element 26' of 26 extends, is also void of the material of the insulating layer 25. Extending across the upper surface of layer 25 is a third circuit element 27 which may be applied as a thin element, coating or film of metal thereto. The strip 27 crosses strip 24 and is insulated therefrom by the layer 25 of dielectric material. The end 27' of element 27 is shown as extending across the area 23' and is in surface contact with the end 26' of element 26. The element 27 may be applied to insulating layer 25, area 23' and element 26' by any of the techniques described for the application of 14 to 12 including vacuum deposition, electro deposition or plating, spraying, or adhesively bonding to layer 25 with the end 27' thereof welded or soldered to element 26'. The structures illustrated in FIG. 5 are applicable to the fabrication of various improved circuit elements and circuits in which a high density of components per unit volume is desired. It can easily be seen that if the circuit elements 24, 26, 27 etc. are applied as thin layers or films and the insulating layer or layers 25 are applied there-between as thin layers or films, a substantial number of circuits may be constructed as a multiple layer unit with each circuit element or group of elements in one layer separated from those of the next layer as well as from each other by respective layers of deposited metal which has been completely converted to an oxide or other dielectric compound as described.

In another form of the invention it is noted that in constructing a multi-layer circuit element of the types illustrated in FIGS. 1 to 5, one or more of the metal coatings such as layer 25 may be only partly converted to the oxide or dielectric compound of such metal with remaining portions serving as further circuit elements. Such partial conversion of the dielectric material may be effected by masking those areas of the film or coating to prevent their exposure to the oxidizing atmosphere or chemical, which masking may comprise a removable stencil or may be a coating of a dielectric material applied permanently thereto or stripped therefrom thereafter.

Various modifications in the structures illustrated in FIG. 5 are possible and may include the provision of additional layers of dielectric material and circuit conducting elements over those shown, the securing of separate circuit components to exposed areas of the circuit components such as the end 24' of strip 24 and end 26', which components may be integrally bonded to the base and may also be coated with a dielectric material as described or masked to prevent said coating. Various electrical components such as capacitors, diodes, semiconductors, resistors and the like may also be applied to device 20 and electrically connected to one or more exposed portions of circuit elements deposited or otherwise secured thereto by means of vacuum or electro deposition, spraying or other known techniques for the construction of more elaborate circuits. A mask or masking means may be applied to define the areas of these materials which are deposited on the exposed surface of the base 22, conducting element 27 or dielectric layer 25. In other words, the circuit elements may be formed by selective deposition on the base material, the dielectric layer may be formed by the selective deposition of a metal and/or the selective conversion of all or parts of such metal to an oxide or dielectric compound thereof and the subsequent circuit elements may also be formed by the selective deposition of a metal on the resulting upper surface.

FIG. 6 illustrates a modified form of the embodiment presented in FIGS. 1 to 4 in which only the exposed surface of the circuit element 14*a* which is bonded to the upper surface 13 of base 12 is coated with an oxide or dielectric layer 28. The layer 28 may be formed by exposing the element 14*a* to an oxidizing atmosphere or liquid and converting part of it to the oxide of such metal forming layer 28. The outer surface of element 14*a* may also be coated with a film or layer of a metal such as that comprising layer 16 which may thereafter be converted to its dielectric compound as described. The exposed surface of strip 14*a* itself may also be converted to the dielectric compound of the metal by treatment with an oxidizing chemical. In other words, the layer 28 of oxidizing material may be made by conversion of the surface layer of said element.

In FIG. 7, there is shown a further structure in an electric circuit member or circuit board made in accordance with the teachings of the invention. The assembly 30 comprises a base member such as an insulated sheet or board having a first circuit element 34 in the form of a strip, coating or film deposited or adhesively bonded thereto. A second conductor 36 in the form of a thin, flat strip or film of metal extends lateral to element 34 and crosses thereover. The notation 35 refers to an insulating layer of limited area disposed between circuit elements 34 and 36 in the area of cross-over. The patch 35 may be formed by vacuum or electro-depositing a metal through a mask or stencil after the formation or securing of element 34 to base 32, directly over that length of element 34 across which layer 36 will pass. Thereafter the patch of metal film or coating 35 is converted, at least in part, to the oxide or dielectric compound of the metal over which strip 36 is deposited or adhesively secured. The notation 37 refers to another conducting strip of metal which has been deposited with strip 34 and is shown electrically connected to strip 36 which is deposited directly thereon.

FIG. 8 shows a cross-over structure for two circuit elements on the surface of a base 32. The circuit element 34 adjacent base 32 is provided of sufficient thickness to permit part of the upper portion or surface layer 34*c* thereof to be converted to a dielectric oxide layer for a length sufficient for a second circuit element 36' to be deposited or otherwise secured to the upper surface of the strip and to be insulated from the conducting portion thereof. The notation 34*a* refers to the remaining, lower portion of strip that segment of 34 which is still conducting. If it is desired to retain the cross-section of the portion 34*a* of strip 34 equal to that of the cross-section of the rest of the strip so that the resistance thereof will not be greater than that of the rest of the strip, the strip may be provided of increased width along the length thereof defined by portion 34*a*.

FIG. 9 illustrates additional structures in printed circuit boards and the like provided in accordance with the teachings of this invention. The circuit board or assembly 40 consists of an insulated base 42 on which a first circuit element or element 44 is deposited or otherwise provided as described. The notation 44*c* refers to a section of element 44 which has been completely converted to an oxide or other compound rendering it a dielectric which divides element 44 into two segments, 44' and 44''. The conversion of section 44*c* to the oxide of said metal may be effected by masking the remaining surface of element 44 and applying an oxidizing atmosphere to the outer surface of section 44*c* for a sufficient time to permit complete conversion of said metal. If element 44 is applied as a film or layer coating all or a substantial portion of the upper surface 43 of 42, a circuit in the form of element 44 and others may thus be formed thereof by converting the areas between what will eventually be the conducting elements to the dielectric compound of the metal layer or film from which element 44 is formed.

To one side of section 44*c* a portion of 44'' has been partly converted to dielectric material by masking the remainder of the element and exposing the surface of a segment 44*c'* to a dielectric forming chemical or atmosphere for a sufficient time to convert a predetermined thickness thereoff to a non-conductor or semi-conductor. The remaining portion 44*a* of segment 44'' is of substantially less thickness than the rest of segment 44'' and if the strip is of substantially constant thickness, portion 44*a* will have a higher resistance and may be used as a resistor in the circuit defined in part by segment 44''.

Deposited over circuit elements 44 is a layer or film of metal which has been converted as described to a dielectric material with the exception of areas such as 45*a* thereof which have been masked from the oxidizing atmosphere and may be electrically connected to either or both the lower conductor and an upper conductor 46 which has been deposited or otherwise applied thereover. In other words, the dielectric layer 45 may also be used as part of the circuit.

If all layers of a circuit member such as 40 are deposited by vacuum or electrodeposition and circuits are formed thereof as provided in FIG. 9 by conversion of certain areas of each layer to a dielectric material as described without substantially reducing or increasing the thickness of each layer, then, it is noted that each circuit element or conductor will remain in its particular layer and will not extend out of such layer in order to conform to a changing upper surface of the type which results from the selective deposition of conducting circuit elements and components. The significance of such fabrication method is that any number of circuit layers may be stacked one on the other without eventually resulting in a formation with a highly irregular surface on which it is difficult to add or deposit circuit components due to the contour thereof. By the structure and method of FIG. 9 the circuits and components of one layer may be electrically connected to those of the next layer above or below which it is insulated from by the intermediate layer of dielectric material 45 by not converting a portion of the intermediate layer which is in alignment with the circuit elements to be connected. For example, the portion 45*a* of intermediate layer 45 is retained as a metal by masking it so that it is not converted to the oxide when the upper or outer surface thereof is exposed to the oxidizing atmosphere. Conducting portion 45*a* therefore electrically connects strip portion 46*b'* with portion 44'' in the lower conducting layer 44. If it is desired to deposit or secure other circuit elements or conducting or semi-conducting materials for connection to circuit elements in any particular layer, a mask may be used for the etching of selected areas of the layer or layers therebeneath so that material may be deposited in the resulting cavity or secured therein and may be retained below the surface of the layer. By completely filling the cavity with material, an uninterrupted surface may be presented for the next layer to be deposited on.

Illustrated in FIG. 9' is a further circuit construction which may be applied to a circuit member such as 40. Shown therein are three deposited layers of conducting and non-conducting material. The lower layer 44*x* may be part of a further circuit stack or may be directly secured to a base such as base 42 of FIG. 9. An intermediate dielectric layer 45' covers the conducting strip 44 and the non-conducting portion of its layer. A third layer 46*x* of conducting and non-conducting material is deposited on layer 45' and formed into a circuit as described. The notation 48 refers to a cavity or hole provided through two or more of the layers which cavity may be provided by mechanical or electrical drilling, milling or etching. The hole passes through a conductor 46*c* in the upper layer 46*x*, through the insulating layer 45' and through an insulating portion 44*c* of the lowest illustrated layer 44. A semi-conducting material may be filled or deposited by any known means in the multi-layer hole or cavity thus provided which material may form a component of substantial thickness as compared to the thickness of one of the layers. The resulting component may be electrically connected to one or more circuit elements of the upper layer by contact therewith and may completely fill the cavity or by surrounded with a potting compound to fill out the remainder of said cavity so as to provide an upper surface which is flat. Contact of the lower end of the component with a conductor in a lower stratum or layer may be used to effect electrical connection therewith, whereupon that portion of the cavity or hole would be made through a conducting portion of the layer. Partly filling the hole with a conducting material such as a liquid metal or a deposited metal will assure electrical connection of the lower portion of the component with the conductor of the lower level. Electrodeposition may be employed to provide the connecting material in the hole for connecting the component placed or deposited in the hole with the conductor of the lower layer by exposing the cavity with the component therein and partly filling the cavity to the flow of vacuum or electrodeposited material.

Subsequently deposited layers of conducting material such as layer or strip 46 applied above the dielectric layer 45 may be etched or partly converted to dielectric material for the formation of circuits and circuit components such as the described resistor portions. Capacitance circuits may also be provided where two or more layers or strips of conducting material cross each other and are separated by a thin dielectric layer of the type described. A unique capacitive-resistance circuit construction is illustrated in FIG. 10. The assembly comprises, at least in part, a first conducting layer or strip 54 deposited or otherwise secured to a circuit board or base 52, over at least part of which, there is provided a thin dielectric layer 55. A second strip of metal 56 extends oblique or normal to strip 54 across layer 55. A portion 56*c* of strip 56 has been converted to dielectric material by masking and exposure, as described, to an oxidizing atmosphere for a predetermined time period, leaving a portion 56*a* of strip 56 in the area of cross-over. The junction 51 or cross-over area thus provides a resistance in the circuit comprising element 56 and a capacitance between strips 56 and 54.

Whereas the dielectric portion 56*c* is shown in FIG. 10 as extending only partly across the width of the strip 56, the entire width of strip 56 may be converted to the dielectric oxide compound in the manner that strip 46*a* of FIG. 9 is converted by exposure of the entire width thereof to said oxidizing atmosphere. The remaining conducting portion 56*a* may have any desired thickness from that in the order of microns or less to several thousandths of an inch depending on the characteristics desired of the resistor and the conducting layer portion. In other words, the structure of FIG. 10 may be used to provide film resistors which are an integral part of a conductor of substantially greater thickness.

As heretofore stated, dielectric coatings may be provided of coatings or films of metal deposited by vacuum deposition means on circuit members by oxidizing the film by exposure to an oxidizing atmosphere. Thin films of aluminum may be converted to aluminum oxide, a dielectric, by exposure to oxygen such as that present in air. To hasten the process, the part and/or the atmosphere may be heated. Fluoride coatings of the metal such as that obtained when aluminum is exposed to hydrogen fluoride, may also be provided and result in an effective dielectric coating for the conductor(s) of the circuit devices.

The following procedure for providing a dielectric coating on an article of manufacture is noted which will reduce the time required for processing the article and provide a coating of superior quality. The article is first heated either prior to or after its admission to a vacuum chamber, to a predetermined temperature. The article is mounted or otherwise made an electrode of the vacuum metallizing system or positioned whereby it will receive the vapor of the metal which is thereafter vapor deposited thereon. Portions of the surface of the article may be masked to prevent deposition on the surfaces thereof. Either during the vacuum deposition process while the metal is being deposited on the article or immediately thereafter, a predetermined quantity of the oxidizing material, such as hydrogen fluoride, is introduced into the chamber preferably adjacent the surface which is coated or is being coated. As a result, reaction takes place immediately while the article is at elevated temperature in the vacuum chamber. Notable advantages of this process include: (a) An improved bond of the vaporized metal to the article is effected due to the heating of the vaporized layer and the resulting effect on the physical state thereof. A molecular bond or welding of the vacuum desposited layer of metal is effected if the surface temperature of the article is in the range of 600° C. for aluminum. (b) The conversion to the oxide or fluoride dielectric compound of the metal occurs more rapidly since the coating metal is at elevated temperature. (c) The need for reheating and rehandling the articles is eliminated and cycle time is reduced. The article to be coated, may be heated while in the vacuum chamber after the normal atmosphere or air has been removed therefrom, by induction heating means or other means thereby reducing or eliminating surface oxidation resulting from exposure to the air temperature and providing a vacuum coating of known composition on a surface of known composition. In other words, the quality of the coating as well as that of the surface on which it is deposited is known and may be retained without the introduction of impurities by heating the article in the vacuum chamber or in a chamber having a known atmosphere of vaporizing metal and/or oxidizing composition or atmosphere. By employing apparatus which introduces the vaporized metal and an oxidizing vapor or gas such as hydrogen fluoride simultaneously against the surface of the base or circuit board, the metal may actually reach the surface of the board in a partially or completely converted or oxidized state.

Other forms of the invention are noted as follows:

The gaseous anodization techniques described for oxidizing thin metal films to form dielectric materials including a variety of different metals, alloys and metal compounds deposited as films, plated, sprayed or otherwise applied to a base and/or each other for use in the fabrication of both active and passive electronic circuit elements. Semi-conductors may also be formed by the described techniques. In particular, the technique illustrated in FIG. 10 may be used to form tunneling barriers and other portions of semi-conductor devices of relatively thin cross section. Integrated micro-electronic circuits may also be similarly fabricated by selectively exposing selected areas of conducting and/or semi-conducting material or materials deposited as layers or films on a substrate and, in certain instances, on each other to oxidizing atmospheres.

Heating to predetermined temperatures and/or etching of selected areas of films deposited as described while exposed to an oxidizing atmosphere may be effected for causing predetermined changes in composition of the device or layer may be effected by an intense electron beam or intense coherent light beam or beams such as generated by a laser which are either directed along a fixed path while the substrate is moved or are deflection controlled to scan selected areas of the deposited material. The beam or beams may be operative to heat the selected area or areas to a temperature whereby the oxidizing atmosphere converts the heated area to a dielectric material while the surrounding areas which are not so heated, are not so affected.

The oxidizing atmosphere may be replaced by an etchant such as a vapor of an acid operative to perform material conversion or etching of those areas exposed through a mask or selectively heated as described while the surrounding areas are not so heated. Semi-conducting materials such as compounds of germanium, silicon, tantalum and others may be selectively oxidized as described to form tunneling barriers, collector domains, electron sinks and integral electronic devices.

Selective introduction of certain impurities in the oxidizing atmosphere and/ or electron beam may also be used to dope the film as it is anodized to provide various electronic devices.

By employing fabrication techniques as herein described a flat, helical conductor 60 which may be used as an electrical inductance may be fabricated in a variety of shapes, one of which is illustrated in FIG. 11 in which the device is formed by depositing a plurality of layers 62 of conducting metal on a substrate 61 and converting predetermined through and through portions of each layer to a dielectric material by exposure to an oxidizing atmosphere. The metal film deposited as a first layer 63 on substrate 61 is converted to a dielectric compound of the metal save for a plurality of diagonal strip portions **63*c* of the metal which are spaced apart and extend substantially parallel to each other. A next metallic layer 64 is deposited on the converted layer 63 over the strip portions 63*c* and is converted to dielectric material save for small area portions 64*c* aligned with portions 63*c* at the ends thereof. A plurality of layers of metal represented by the single layer 65 may be thereafter deposited and selectively converted to dielectric material to build up the helix in which conducting portions such as 65*c* overlaying portions 64*c* remain of the entire layers after selective oxidation thereof. The uppermost layer 66 of the plurality of layers 62 is converted to the dielectric compound of the metal save for strip portions 66*c* which overlie the portions 65*c* and connect the ends of strip portions 63*c* through the remaining metallic interlayer elements 64*c*, 65*c*, etc. A helical conductor is thus provided and includes elements 63*c*, 64*c*, 65*c* and 66*c* of the multiple layers which may be used as an inductor. The layers 63 to 66 may contain many more layers therebetween which layers may also have other conducting elements formed or deposited therein as part of the same circuit containing said helical conductor or parts of different circuits. Formation of layer conducting elements 63*c*, 64*c*, 65*c*, etc. is effected by the application of masks over the areas of each metal layer where the element is to remain while exposing adjacent areas to an oxidizing atmosphere or selectively depositing metal in the areas and dielectric film onto adjacent areas. Conductors 63*c*, 64*c*, 65*c* and 66*c* forming the helical conductor 60 may also be selectively formed by selective plating or the selective vacuum deposition of the elements with the surrounding volume being filled with dielectric material by any suitable means; strip formation 63*c* and 66*c* may also be curved or shaped other than as straight strips or bars to vary the shape of the indicator or coil 60**.

The technique of masking and oxidizing only selected through and through areas of conducting films or coatings to provide conductors or circuit elements in the remaining areas may also be used to fabricate switching matrices as follows:

(a) First masking a conducting surface such as a sheet of glass and sputtering or otherwise vacuum depositing components as magnetic film materials on selected areas thereof which become thin film switching elements.

(b) Next masking over the magnetic materials and sputtering or otherwise vacuum depositing a second conducting metal on remaining areas.

(c) Next masking part of the second metal and converting areas theerbetween to dielectric compound of the metal by exposure to an oxidizing atmosphere leaving conducting elements or strips connecting the components or overlying the components.

(d) Layers of such components and/or conductors may be formed one on the other to provide switching matrices, circuits, etc.

FIG. 12 illustrates part of a switching matrix 70 formed by the selective oxidation of alternate layers of metal vapor deposited on a non-conducting base 71. A first layer 72 is deposited on base 71 and oxidized save for a strip or plurality of paralleled portions **72*c* thereof. A second layer 73 of metal is sprayed or vacuum deposited on the upper surface of layer 72 and completely oxidized. A third layer 74 is deposited on layer 73 except in a plurality of volumes of cylindrical or other shape in which are deposited magnetic material such as nickel or other ferro-magnetic alloys which define electronic components memory devices or cores 74*c* operative to generate magnetic fields which are oriented in accordance with signals generated in conductors 72*c* and 76*c*. Such structure is effected by deposition procedures involving masking. A fourth layer 75 is deposited on top of layer 74 and is completely oxidized to form a dielectric layer. A fifth layer 76 is deposited on top of layer 75 and is oxidized with the exception or parallel strip areas 76*c* which remain as conducting metal, strip areas so aligned that conductors 72*c* and 76*c* cross each other in alignment with component 74*c*. A current passing through either conductor will thus affect magnetization of cores 74*c*. The ends of conductor elements 72*c*, 74*c*** are electrically connected to computer input switching means.

Means other than the hereinbefore described technique of vacuum deposition of metal film and conversion of portions thereof to oxide film may be employed to fabricate devices of the type illustrated in FIG. 12. Techniques involving the selective area deposition of metallic films, semi-conducting and insulating materials by solution deposition or plating, sputtering or electron beam deposition means may be employed to supplement or replace the hereinbefore described fabrication means.

The hereinbefore described procedures for fabricating electrical circuits and circuit elements by partially anodizing or oxidizing metal coatings or films applied to a substrate or other coatings, may be utlized for the fabrication of insulated electrical conductors such as elongated strips and wires of metal as well as single or multiple layer cables made of a plurality of thin strip conductors formed by metallizing a sheet of insulating material such as a polymer or an insulated metal sheet with a thin film of metal and oxidizing or anodizing selected spaced apart parallel strip areas of the film to electrically isolate the remaining parallel conducting strip areas of metal film. The following procedures are herein presented as forming a part of the current invention:

(I) In a first method, an elongated member made of aluminum or aluminum alloy is formed and provided as a wire, strip or other shape the exterior surface of which is either coated with high purity aluminum and anodized or oxidized or is directly anodized or oxidized as it is formed by drawing, rolling or extruding the member to shape. The coating or anodized surface layer is thereafter exposed to the oxidizing carriers of fluorine or the like to provide a fluoride dielectric film on the exterior surface of the wire or strip. Cold working by drawing or reverse rolling the conductor may be applied either prior to or after providing the dielectric film providing an improved wire type conductor and insulation means therefore since the anodized layer improves the strength of the structure while the dielectric film provides an insulating layer which is superior to the anodized coating alone. If cold worked prior to the application of the fluoride atmosphere, the anodized layer or coating may provide a hard, non-porous sheathing or coating on the aluminum conductor base or coating thereon which coating also improves the adhesion between the dielectric insulation formed thereafter and the wire. The same procedure may be applied to shapes other than wires of constant cross section or parallel strips such as circuit elements, connectors, etc. Such a procedure may offer a substantial improvement over the procedure involving conversion of the surface layer or a film coated thereon to dieelectric film or oxide film without previously anodizing and cold working the anodized layer due to improvements in the bond and hardness of the subsurface structure defined by the anodized layer.

The first method may also be modified whereby the base shape or wire may comprise copper or any suitable metal which is coated with aluminum which is partly or entirely anodized prior to the conversion of the surface layer thereof to a fluoride dielectric film or coating.

Strip conductors or wire made of multiple layers of conducting metal electrodeposited or vaporized on layers of dielectric film (with or without intermediate anodizing and cold working) may be formed as described, on a continuous basis by completely or partially converting each layer to a dielectric film as described with interposed layers or strip portions thereof remaining unconverted to serve as conducting elements.

(II) In a second method, a conductor such as a wire, a strip or strips of copper, alumnium or alloys thereof is moved through an opening or openings in a wall of a chamber from a supply thereof such as an extruder of the metal or drawing mill, in which chamber an oxidizing carrier of fluorine such as hydrogen fluoride or elemental fluorine is continuously introduced and caused to flow against the wire or wires after heating the wire by induction or electron or laser radiation beams means to raise its temperature to the range of 300 to 600 degrees centigrade. The conductor is maintained as it travels in the chamber in said oxidizing atmosphere until a dielectric film of fluoride of a desired thickness has formed on the aluminum surface or coating on the base whereafter it is continuously fed through a cooling zone in the chamber. A further opening in a wall of the chamber, which like the first opening, sealingly receives the wire which passes therefrom to a coiling or further processing apparatus.

(III) Fluoride dielectrics of the type hereinbefore described may be utilized for insulating and protecting articles such as wire, fasteners, clips or other devices having the major portion thereof made of a ferrous metal such as steel. As the fluoride dielectrics are formed on the base metals at temperatures in the range of 300–600 degrees centigrade (500–1100 degrees Fahrenheit) and, since many steels may be tempered and hardened in this range and the fluoride dielectric forms to a suitable thickness in about the time it requires to form such steel transformations as martensite, pearlite and spherodite, a process is herein proposed which includes the simultaneous formation of such steel transformations and the provision of a fluoride dielectric coating as described. The procedure may include heating the ferrous metal alloy base and processing the surface thereof to suitably receive an aluminum coating, coating with aluminum or other suitable metal, maintaining or varying the temperature thereof to provide it at the desired degree to form the dielectric coating and tempering or hardening the base metal, converting all or part of the coated metal to the dielectric, fluoride insulating compound and either slowly or rapidly cooling the article and coating thereafter to provide the base metal in the desired grain structure. Slow cooling will result in a pearlite structure whereas fast cooling attained, for example by quenching, will result in the martensite or spherodite structure depending on the temperature at which cooling is started and the rate of cooling.

Steel wire or cable may be continuously processed as hereinbefore described by the continuous coating thereof with aluminum and conversion of all or part of the coating to the fluoride dielectric compound of the aluminum.

As both the coating and fluoride film techniques require substantially clean, scale-free surfaces, it is proposed to eliminate the need to clean and initially heat the metal in the processing of elongated shapes such as wire by extruding or hot rolling the metal wire from either the liquid or semi-molten condition directly into the chamber containing the oxidizing character of fluoride so as to prevent the introduction of other impurities into the surface being coated and so treated. The procedure may include working the base metal and/or coating thereon prior to or after cooling so as to improve the strength and surface characteristics thereof by rolling, bending or the like. Rapid cooling may be effected of the elongated shape after it is coated so as to form a crystalline structure of the base portion thereof having desired characteristics as described.

I claim:

1. A multi-layered electrical assembly comprising a plurality of uniform thickness coextensive layers successively applied in overlapping arrangement on a base having an insulating surface, said layers providing a plurality of circuit elements supported on the surface of said base, a first of said layers including at least a first conducting circuit element comprising a thin metallic coating on said insulated surface of the base, a second of said layers overlying said first layer and including coplanar dielectric and thin metal film portions, said dielectric portion covering at least part of said first circuit element, said dielectric portion being a non-conducting oxide of said metal film of said second layer, a third layer overlying said second layer and including a thin coating of metal on said dielectric portion and providing a second circuit element insulated from said first circuit element by said dielectric portion of said second layer.

2. A multi-layered electrical assembly as set forth in claim 1, wherein at least two of said coextensive layers include both conductive and non-conductive portions, said conductive portions being formed of a thin metal film, said non-conductive portions being formed of dielectric oxide of said metal film, the location and configuration of dielectric portions in one of said layers differing from the location of the dielectric portion in the other of said layers.

3. A multi-layered electrical assembly as set forth in claim 1, wherein each of said coextensive layers includes both conductive and non-conductive portions, each of said coextensive layers being of uniform thickness forming a multi-layered assembly of uniform thickness over its entire extent.

4. In a printed circuit assembly, a base support having a flat insulative surface, a substantially uniform thickness conductive metal pattern applied to said insulative base surface, a predetermined portion of said conductive pattern having a partial depth thereof, including the outer surface thereof, formed of the oxide of said conductive metal pattern, the remaining portion of said metal pattern immediately below said oxide portion providing appreciably increased resistance to electrical current flow by its reduced thickness, whereby said reduced conductive portion provides an electrical resistor completely within said conductive metal pattern and the immediately adjacent full thickness conductive portions provide circuit connecting means to said electrical resistor.

5. In a printed circuit assembly as set forth in claim 4, wherein said electrical resistor includes in combination therewith an electrical capacitator comprising a second overlying conducting strip of metal with at least a portion of said strip being adjacent the reduced thickness portion of said electrical resistor and insulatingly separated therefrom by said oxide portion.

6. An electrical resistor comprising in combination with a base support for said resistor, a planar strip material layer secured to a surface of said base, said planar layer including at least three portions, a first lead portion formed of a metal of substantially constant layer thickness, a resistance portion of partial layer thickness immediately below a substantial strata of the strip formed of a dielectric oxide of said metal material leaving a metal layer beneath of smaller cross section than that of said first lead portion which serves as a resistance element, and a second lead portion of said metal of substantially the same thickness as said first lead portion, both said lead portions being integral extensions of the material forming said resistance portion.

7. An electrical assembly comprising a base, a first conductor in the form of a first thin layer of metal secured to said base, a thin film dielectric compound of said metal forming a portion of the upper strata of a segment of said first conductor, and a second conductor in the form of a vacuum deposited, second thin layer of said metal crossing over said first conductor and insulated therefrom by said thin dielectric film.

8. A method of fabricating an electrical circuit comprising the steps of successively vacuum depositing at least first, second and third thin layers of a first material on a base member, with selected portions of said thin layers being converted to a non-conducting compound of said material, prior to the application of the next successive layer, providing cavities through at least a partial thickness of said layers, depositing a semi-conducting material into the cavities and providing the conducting portion of said first material as thin conducting strips for circuit interconnecting the material deposited in said cavities.

9. A method of fabricating a multi-layer electrical switching matrix comprising the steps of depositing a thin film of electrical conducting material on an insulated surface of a base member, converting portions of said conducting film to an insulating film to define strip-like conductors, depositing a further film of conducting material over the first film, converting said further film to an insulating film by subjecting it to an oxidizing chemical, providing spot-like switching elements of magnetic material on said insulating film adjacent respective of said strip-like conducting areas there beneath, providing a further insulating film over the spot-like deposits of magnetic material, depositing a further film of metal over said further insulating film and converting areas of said further metal film to non-conducting material while leaving a plurality of strip-like band areas of conducting material separated from each other by non-conducting material and extending angularly to the conducting strips there beneath to define an electrical switching matrix.

10. A method of fabricating an electrical switching matrix in accordance with claim 9 in which the total thickness of said matrix is less than .001 inch.

11. A method of fabricating an electrical switching matrix comprising the steps:

(a) depositing a thin film of metal on an insulating surface of a base support,
(b) exposing certain areas of said film to an oxidizing atmosphere to convert the entire metal layer to a non-conducting compound of said metal leaving areas of said film in the shape of conducting strips of metal extending substantially parallel to each other and separated by said non-conducting metal compound,
(c) depositing a second layer of metal as a thin film over the first layer,
(d) exposing said second layer to an oxidizing atmosphere to convert substantially the entire layer to a non-conducting compound of said metal,
(e) selectively depositing a plurality of spot-like, thin film formations of magnetic material in alignment with respective of said strip-like conducting areas of said layer, said magnetic material capable of being magnetically oriented in at least two directions in accordance with the direction of a magnetic field applied in the vicinity thereof,
(f) Depositing the third layer in the form of a thin metal film over said second layer and said deposits of magnetic material,
(g) Converting areas of said third layer to an insulating compound of said metal by exposure to an oxidizing atmosphere while leaving strip-like areas thereof as conductors which extend substantially parallel to each other and oblique to said strip-like conductors in said first layer to define a thin film switching matrix.

12. A method in accordance with claim 11 including the further steps of providing a film of insulating material over said three layers and repeating the procedure to form a switching matrix thereabove.

13. A method in accordance with claim 12 including the further step of providing connection means for said strip-like conducting areas.

References Cited

UNITED STATES PATENTS

| | | | |
|---|---|---|---|
| 2,812,270 | 11/1957 | Alexander | 117—107.1 XR |
| 2,975,345 | 3/1961 | Koller | 117—107.1 XR |
| 3,085,899 | 4/1963 | Forman | 336—200 XR |
| 3,142,783 | 7/1964 | Warren | 174—68.5 XR |
| 3,124,721 | 3/1964 | Rayburn et al. | 317—101 |
| 3,128,332 | 4/1964 | Burkig et al. | 174—68.5 |
| 2,854,318 | 9/1958 | Rummel | 118—49.5 |
| 3,134,695 | 5/1964 | Henkel et al. | 118—49.5 |
| 2,088,949 | 8/1937 | Fekete. | |
| 2,721,822 | 10/1955 | Pritikin. | |
| 2,993,266 | 7/1961 | Berry. | |
| 3,169,892 | 2/1965 | Lemelson | 117—212 X |
| 3,191,098 | 6/1965 | Fuller | 174—68.5 X |
| 3,210,707 | 10/1965 | Constantakes | 336—200 |
| 2,441,960 | 5/1948 | Eisler. | |
| 2,699,424 | 1/1955 | Nieter. | |
| 2,773,239 | 12/1956 | Parker. | |
| 2,837,619 | 6/1958 | Stein. | |
| 2,900,282 | 8/1959 | Rubens | 340—174 |
| 2,994,846 | 8/1961 | Quinn | 338—310 X |
| 3,102,213 | 8/1963 | Bedson et al. | 174—68.5 |
| 3,105,729 | 10/1963 | Rosenthal et al. | |
| 3,148,356 | 9/1964 | Hedden | 174—68.5 X |
| 3,165,672 | 1/1965 | Gellert | 174—68.5 X |
| 3,202,591 | 8/1965 | Curran | 174—68.5 X |

FOREIGN PATENTS

| | | |
|---|---|---|
| 1,345,163 | 8/1963 | France. |

DARRELL L. CLAY, Primary Examiner

U.S. Cl. X.R.

117—107, 213; 118—49; 174—68; 317—234, 258; 204—15; 336—200; 338—195, 307; 340—166, 174